US012785657B2

(12) United States Patent
Chou et al.

(10) Patent No.: US 12,785,657 B2
(45) Date of Patent: Nov. 3, 2026

(54) QUARTZ CRYSTAL RESONATOR AND MANUFACTURING METHOD

(71) Applicant: Diodes Incorporated, Plano, TX (US)

(72) Inventors: Ta-Jen Chou, Taoyuan City (TW); Po-Yang Su, Taoyuan City (TW); Yi-Sheng Chiang, Taoyuan City (TW)

(73) Assignee: Diodes Incorporated, Plano, TX (US)

( * ) Notice: Subject to any disclaimer, the term of this patent is extended or adjusted under 35 U.S.C. 154(b) by 748 days.

(21) Appl. No.: 18/208,707

(22) Filed: Jun. 12, 2023

(65) Prior Publication Data

US 2024/0213954 A1 Jun. 27, 2024

(30) Foreign Application Priority Data

Dec. 22, 2022 (CN) ......................... 202211657114.4

(51) Int. Cl.
*H03H 9/19* (2006.01)
*H03B 5/32* (2006.01)
*H03H 3/02* (2006.01)

(52) U.S. Cl.
CPC ................ *H03H 9/19* (2013.01); *H03H 3/02* (2013.01); *H03B 5/32* (2013.01)

(58) Field of Classification Search
CPC ........ H03H 3/02; H03H 9/19; H03H 9/02023; H03B 5/32
See application file for complete search history.

(56) References Cited

U.S. PATENT DOCUMENTS

| | | | |
|---|---|---|---|
| 4,306,170 A | 12/1981 | Motte et al. | |
| 6,849,991 B2 | 2/2005 | Zhang et al. | |
| 7,157,983 B2 * | 1/2007 | Tanaka ............... | H03H 9/02551 331/158 |
| 2003/0218512 A1 | 11/2003 | Zhang et al. | |
| 2007/0001555 A1 | 1/2007 | Tanaka et al. | |

(Continued)

FOREIGN PATENT DOCUMENTS

| | | |
|---|---|---|
| EP | 0516400 B1 | 7/1997 |
| JP | S5537052 A | 3/1980 |
| JP | H10284978 A | 10/1998 |

(Continued)

OTHER PUBLICATIONS

Office Action for Japanese Patent Application No. 2023-203493, mailed on Nov. 8, 2024, 5 pages.

(Continued)

*Primary Examiner* — J. San Martin
(74) *Attorney, Agent, or Firm* — AP3 Law Firm PLLC

(57) ABSTRACT

A quartz crystal resonator including a quartz crystal obtained from a quartz bar is provided. The quartz bar has a light axis, an electrical axis along a length of the quartz bar, and a mechanical axis that are perpendicular to one another. The quartz crystal has a major face cut from the quartz bar along a cutting plane. The cutting plane has a first angle of about 35° to about 36° with the light axis and has a second angle with the electrical axis. The first angle is obtained by rotation about the electrical axis, and the second angle is obtained by rotation about the light axis, such that the quartz crystal has a vibration frequency deviation inflection point in a range from about 30° C. to about 45° C. Methods for making the quartz crystal are also provided.

20 Claims, 6 Drawing Sheets

(56) References Cited

U.S. PATENT DOCUMENTS

| | | | | |
|---|---|---|---|---|
| 2012/0068573 | A1 | 3/2012 | Obata | |
| 2025/0351729 | A1* | 11/2025 | Su | H03H 3/02 |

FOREIGN PATENT DOCUMENTS

| | | | |
|---|---|---|---|
| JP | 2003324332 | A | 11/2003 |
| JP | 2004007420 | A | 1/2004 |
| JP | 2004289285 | A | 10/2004 |
| JP | 2005191866 | A | 7/2005 |
| JP | 2007013381 | A | 1/2007 |
| JP | 2016174265 | A | 9/2016 |
| WO | 2023181487 | A1 | 9/2023 |

OTHER PUBLICATIONS

Office Action for Korean Patent Application No. 10-2023-0139337, mailed Dec. 4, 2024, 19 pages.

Extended European Search Report for European Application No. 23206581.3, mailed May 7, 2024, 10 pages.

Office Action and Search Report for Taiwan Patent Application No. 112100487, mailed Nov. 3, 2023, 19 pages.

Wang S., et al., "Novel Cuts of Triply-rotated Quartz Crystal for Resonators with Ideal Cubic Frequency-temperature Relations," 2019 Symposium on Piezoelectrcity, Acoustic Waves and Device Applications (SPAWDA), Jan. 2019, 6 pages.

Office Action for European Patent Application No. 23206581.3, mailed Oct. 30, 2025, 7 pages.

* cited by examiner

QUARTZ CRYSTAL RESONATOR AND MANUFACTURING METHOD

CROSS-REFERENCE TO RELATED APPLICATIONS

This patent application claims priority to Chinese Application No. 202211657114.4, filed on Dec. 22, 2022 and entitled "Quartz crystal resonator and manufacturing method thereof," which is hereby incorporated by reference herein as if reproduced in its entirety.

TECHNICAL FIELD

The present disclosure relates to the field of crystal resonators, and in particular embodiments, to a quartz crystal resonator and manufacturing method thereof. Specifically, the quartz crystal resonator can maintain a vibration frequency deviation in a small range for an operating temperature range from about −40° C. to about 125° C., and has good ambient temperature tolerance.

BACKGROUND

With the advancement of the integrated circuit technologies, various machine controls that could only be handled by large scale computer systems in the past can now be controlled using semiconductor integrated circuits (such as large-scale integration (LSI), integrated circuits (IC), etc.). In the operation of IC and LSI, the frequency is indispensable. A crystal resonator provides a simple, low-cost and high-accuracy frequency source, is applicable for a wide frequency range and is a suitable choice for many applications, e.g., in equipment for satellite communications and mobile communications, and also in automobiles, televisions, computers or some home appliances.

SUMMARY

Technical advantages are generally achieved, by embodiments of this disclosure which describe a quartz crystal resonator and manufacturing method thereof.

In an exemplary aspect of the present disclosure, a quartz crystal resonator is provided. The quartz crystal resonator includes a quartz crystal cut from a quartz bar, and the quartz bar has a light axis, an electrical axis and a mechanical axis perpendicular to one another. A first angle, rotated by about 35 degrees to about 36 degrees with the electrical axis as the rotating axis, is formed between a major face of the quartz crystal and the light axis, and a second angle, rotated with the light axis as the rotating axis, is formed between the major face and the electrical axis, such that the quartz crystal has a vibration frequency deviation inflection point from about 30 degrees Celsius to about 45 degrees Celsius.

In another exemplary aspect of the present disclosure, a method of manufacturing a quartz crystal resonator is provided. The method comprises: receiving a quartz bar, the quartz bar having a light axis, an electrical axis, and a mechanical axis perpendicular to one another; with the electrical axis as the rotating axis, rotating a first angle of about 35 degrees to about 36 degrees from the direction of the light axis toward the direction of the mechanical axis, and then with the light axis as the rotating axis, rotating a second angle of about 10 degrees to about 12 degrees from the direction of the electrical axis toward the direction of the mechanical axis to obtain a cutting plane; and cutting the quartz bar along the cutting plane to obtain a quartz crystal.

In yet another exemplary aspect of the present disclosure, a method of manufacturing a quartz crystal resonator is provided. The method comprises: receiving a quartz bar, the quartz bar having a light axis, an electrical axis, and a mechanical axis perpendicular to one another. axis; rotating the quartz bar to be at an AT-cut angle; based on the AT-cut angle, and with the light axis as the rotating axis, rotating a correction angle from the direction of the electrical axis toward the direction of the mechanical axis, to obtain a cutting plane; and cutting the quartz bar along the cutting plane to obtain a quartz crystal; wherein, through the correction angle, the cut quartz crystal has a vibration frequency deviation between −20 ppm and +20 ppm in an operating temperature range from about −40 degrees Celsius to about 125 degrees Celsius.

In yet another aspect of the present disclosure, a quartz crystal resonator is provided. The quartz crystal resonator includes a quartz crystal obtained from a quartz bar, the quartz bar having a light axis, an electrical axis along a length of the quartz bar, and a mechanical axis that are perpendicular to one another, and the quartz crystal having a major face cut from the quartz bar along a cutting plane, wherein the cutting plane has a first angle of about 35° to about 36° with the light axis and has a second angle with the electrical axis, the first angle being obtained by rotation about the electrical axis, and the second angle being obtained by rotation about the light axis, such that the quartz crystal has a vibration frequency deviation inflection point in a range from about 30° C. to about 45° C.

In yet another aspect of the present disclosure, a method for making a quartz crystal resonator is provided. The method includes: obtaining a quartz bar, the quartz bar having a light axis, an electrical axis along a length of the quartz bar, and a mechanical axis that are perpendicular to one another; obtaining a cutting plane by rotating about the electrical axis through a first angle of about 35° to about 36° in a direction from the light axis toward the mechanical axis, and thereafter, rotating about the light axis through a second angle of about 10° to about 12° in a direction from the electrical axis to the mechanical axis; and cutting the quartz bar along the cutting plane to obtain a quartz crystal of the quartz crystal resonator.

In yet another aspect of the present disclosure, a method of making a quartz crystal resonator is provided. The method includes: obtaining a quartz bar, the quartz bar having a light axis, an electrical axis along a length of the quartz bar, and a mechanical axis that are perpendicular to one another; rotating the quartz bar to orient the quartz bar at an AT-cut angle; based on the AT-cut angle, obtaining a cutting plane by rotating about the light axis through an angle in a direction from the electrical axis toward the mechanical axis; and cutting the quartz bar along the cutting plane to obtain a quartz crystal of the quartz crystal resonator; and wherein the angle is determined such that the obtained quartz crystal has a vibration frequency deviation within a range from −20 parts per million (ppm) to +20 ppm over an operating temperature range from about −40° C. to about 125° C.

BRIEF DESCRIPTION OF THE DRAWINGS

Various aspects of the present disclosure may be best understood from the following description and accompanying drawings. It should be noted that, in accordance with standard working practice in the related art, various features in the drawings are not drawn to scale. In fact, the dimensions of some features may be enlarged or reduced on purpose for clarity of description.

The technical solutions and beneficial effects of the present application will be made apparent through the detailed description of embodiments of the present application in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
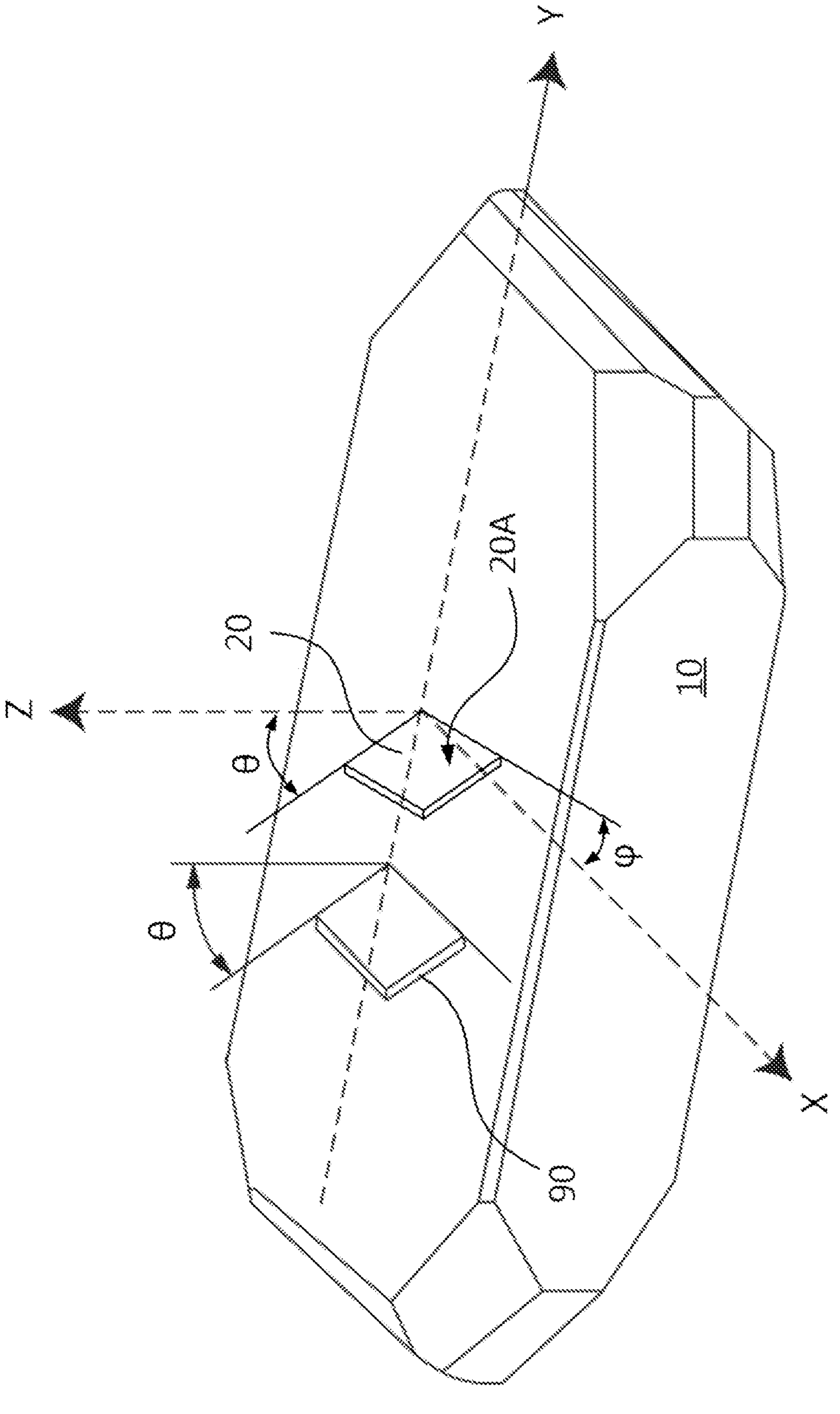
FIG. 1 is a schematic perspective view of a quartz bar showing a cutting method of the quartz bar according to some embodiments of the present disclosure.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The following provides various embodiments or examples for implementing different features of the present disclosure. Specific examples of components and configurations are described below to simplify description of the present disclosure. Certainly, these are examples only and are not intended to be limiting. For example, in the following description, a first member being formed above a second member or the first member being formed on the second member may include an embodiment where the first member and the second member are in direct contact, and also an embodiment where an additional member is formed between the first member and the second member such that the first member and the second member may not be in direct contact. Additionally, the present disclosure may repeat component symbols and/or letters in various examples. Such repetition is for simplicity and clarity, and does not in itself represent a relationship between the various embodiments and/or configurations discussed.

In addition, for ease of description, spatially relative terms such as “under”, “beneath”, “below”, “above”, “on” and the like may be used herein to describe a relationship of a component or member with another component(s) or member(s), as shown in the drawings. Spatially relative terms are intended to encompass different orientations of a device in use or operation in addition to the orientations depicted in the drawings. The device may be oriented in other ways (rotated 90 degrees or at other orientations), and the spatially relative terms used herein may be interpreted in a corresponding way similarly.

As used herein, terms such as “first”, “second”, “third”, and so on, may be used to describe various components, members, regions, layers, and/or sections, and these components, members, regions, layers, and/or sections should not be limited by these terms. These terms may merely be used to distinguish one component, member, region, layer or section from another. The terms “first”, “second”, “third”, and so on, when used herein, do not imply a sequence or order unless clearly indicated by the context.

A quartz crystal resonator is an electronic component that uses the piezoelectric effect of quartz crystal to generate a high-precision vibration frequency. In particular, the quartz crystal itself is a passive component that can be manufactured as a so-called resonator. If the quartz crystal is combined with an integrated circuit designed with an oscillation circuit, it can be packaged as an active electronic component called crystal oscillator (XO), and specific products may include, based on their usage and specifications, a voltage-controlled crystal oscillator (VCXO), a temperature-compensated/voltage-controlled temperature-compensated crystal oscillator (TCXO/VCTCXO), a constant temperature control crystal oscillator (OCXO), and so on. Many electronic circuits need oscillators to synchronize activity or provide a frequency reference. For example, a microcontroller’s frequency signal is used to control movement of data to and from memory, execution of instructions, and external communication speeds; and in a radio system, an oscillator can provide a fixed frequency for communications of a transmitter and a receiver.

A quartz crystal is a single crystal of silicon dioxide, and the quartz crystal (or quartz chip) required in industry can be cut from a quartz bar. The commonly used quartz bar is a perfect single-crystal a-quartz made through artificial growth. Because the quartz crystal is anisotropic, when the quartz crystal is cut along different directions, different geometric slices may be obtained, and the different geometric slices have different oscillation modes. An advantage of the quartz crystal is that when temperature changes, the elastic coefficient and size that affect the oscillation frequency change slightly, and thus the frequency characteristic presented is relatively stable. In strict occasions that require high precision and stability, the temperature of the quartz crystal will be monitored in order to correct errors at any time. If a smaller error is required, in some cases, the quartz crystal or component including the quartz crystal will be placed in an incubator and a vibration-absorbing container to prevent interferences caused by external temperature and vibration.

Performance indicators of a quartz crystal resonator include accuracy, stability, power consumption, and so on. Among them, the first two are very important for communication protocols and time records, and the accuracy and stability of a quartz crystal resonator are closely related to properties of the quartz crystal that the quartz crystal resonator includes. As mentioned earlier, the oscillation of the quartz crystal is from the piezoelectric effect, that is, when a pressure is applied to the quartz crystal, a voltage will be generated inside the quartz crystal (positive piezoelectric effect), and when a voltage is applied, the inside of the quartz crystal will be deformed (reverse piezoelectric effect) . A quartz crystal with feedback can serve as a highly accurate and stable resonator, and its natural frequency depends on the size and cutting manner of the crystal.

In commonly used quartz crystal resonators, a quartz bar is usually cut into thin slices by means of AT-cut, which are used as the quartz crystals required by quartz crystal resonators. In a quartz crystal model, as shown in FIG. 1, three mutually perpendicular axes can be used to represent the directions of the quartz crystal, and the vertical axis is the light axis (i.e., Z axis); the axis passing through the ridgeline of the quartz bar and perpendicular to the light axis is the electrical axis (i.e., X axis); and the axis perpendicular to the light axis and the electrical axis is the mechanical axis (i.e., Y axis). Generally speaking, the piezoelectric effect that generates charges under the force along the electrical axis is called the longitudinal piezoelectric effect; the piezoelectric effect that generates charges under the force along the mechanical axis is called the transverse piezoelectric effect, and there is no piezoelectric effect generated when the force is applied in the direction of the light axis.

The above-mentioned AT-cut, as shown in FIG. 1, is to obtain an AT-cut quartz crystal 90 by cutting from the direction of the light axis toward the direction of the mechanical axis and at an angle of about 35° (according to the definition of the angle, an angle formed by rotating counterclockwise is a positive angle, and an angle formed by rotating clockwise is a negative angle). In some specific examples, the AT-cut is to cut from the direction of the light axis to the direction of the mechanical axis, at an angle of 35 degrees 15 minutes (35° 15') or 35 degrees 25 minutes (35° 25'). In addition to the AT-cut, there are also other cutting methods provided based on actual needs, for example: BT-cut, which is to cut from the direction of the light axis to the direction of the mechanical axis at an angle of about negative 50°, and in some specific examples, the angle is negative 49° or negative 51° 7'; SC-cut, which is carried out through double rotation, by first performing angle selection from the direction of the light axis toward the direction of the mechanical axis at an angle of about 35°, and rotating about 21° from the direction of the electrical axis toward the direction of the mechanical axis to perform cutting, and in some specific examples, these angles include a combination of 34 degrees 11 minutes and 21 degrees 93 minutes respectively, or a combination of 35 degrees 15 minutes and 21 degrees 54 minutes respectively; and other cutting methods may include variations such as GT-cut, IT-cut, and so on, and their specific cutting angles may be fine-tuned based on different characteristics, with fairly small variances between different manufacturing examples (e.g., the angle difference between 35° 15' and 35° 25' in the AT-cut). The quartz crystals obtained by cutting along different angles are different in various aspects such as electromechanical conversion type, conversion efficiency, piezoelectric coefficient, elastic coefficient, dielectric constant, temperature characteristics and resonance frequency, and thus different cutting schemes may be selected to use based on parameters required by quartz crystal resonators.

Embodiments of the present disclosure provide, based on the consideration of the vibration frequency deviation of the quartz crystal in a specific operating temperature range, a novel quartz bar cutting method, to obtain a quartz crystal that can maintain a relatively stable vibration frequency deviation in a large operating temperature range, especially in an extreme working environment having high temperature and low temperature, and the quartz crystal may be used to manufacture a high-quality quartz crystal resonator with good environmental tolerance. The vibration frequency deviation indicates that the actual resonance frequency of the quartz crystal deviates from the original target frequency of the quartz crystal due to temperature changes, and the degree of deviation is usually in a unit of parts per million (ppm), e.g., 0 ppm indicates no deviation. In the present disclosure, the permissible deviation range of the quartz crystal vibration frequency for precision components is set to be ±20 ppm.

In some embodiments of the present disclosure, as shown in FIG. 1, a quartz crystal 20 included in a quartz crystal resonator is cut out from a quartz bar 10, and the quartz bar 10 has a light axis (Z), an electrical axis (X) and a mechanical axis (Y) perpendicular to one another. Between a major face 20A of the quartz crystal 20 and the light axis is a first angle θ that is rotated around the electrical axis by about 35 degrees to about 36 degrees, and between the major face 20A and the electrical axis is a second angle φ that is formed by rotating around the light axis. In some embodiments, characteristics of the quartz crystal include an inflection point of a vibration frequency deviation at about 30° C. (degrees Celsius) to about 45° C.

The inflection point refers to the point where a curve changes from convex to concave or from concave to convex. It can also be determined by the tangent of the curve passing through the curve at the point, and its technical meaning is that the quartz crystal has the most stable vibrational pattern at the corresponding temperature. As shown from the relationship between temperature and vibration frequency deviation in FIG. 2, the relationship between temperature and vibration frequency deviation of the quartz crystal according to the above embodiments of the present disclosure can present the characteristics of cubic curves, and the inflection point—in the example where the second angle φ is 10° or 12°—falls within the range from about 30° C. to about 45° C.

The above-mentioned temperature range is related to a selectable range of cutting angles of the quartz crystal. In some embodiments, the first angle θ is between about 35 degrees and about 36 degrees; in some embodiments, the first angle θ is about 35 degrees 15 minutes; in some embodiments, the first angle θ is about 35 degrees 25 minutes; and in some embodiments, the first angle θ is the same as the cutting angle typically selected for the AT-cut (see the AT-cut quartz crystal 90 as shown in FIG. 1). In other words, according to some embodiments of the present disclosure, the first angle θ may be determined based on the AT-cut angle selection, rotation by the second angle φ may then be performed, and thereafter the quartz bar is cut.

As for the range of the second angle φ, in some embodiments, the second angle φ is between about 10 degrees and about 12 degrees; in some embodiments, the second angle φ is about 10 degrees; in some embodiments, the second angle φ is about 12 degrees; and in some embodiments, the selection of the second angle φ may be based on the consideration that the cut quartz crystal can maintain the vibration frequency deviation within an acceptable range (e.g., within ±20 ppm) in a wide operating temperature range (for example, from about −40 degrees Celsius to about 125° C.).

In particular, the quartz crystal resonator of embodiments of the present disclosure uses a quartz crystal having better tolerance to temperature changes, so that the quartz crystal resonator has a certain level of precision performance in either a cold or hot working environment. Taking automotive electronics as an example, with reference to the automotive specification verification standards formulated by the international Automotive Electronics Council (AEC), the temperature range from about −40° C. to about 125° C. belongs to the discrete semiconductor operating temperature range specified by the AEC-Q101 standard, which is an example of a relatively wide operating temperature range defined in industry. Considering that the quartz crystal obtained through the fixed quartz bar cutting method does not have the characteristics of maintaining a good vibration frequency deviation over a wide operating temperature range, the quartz crystal resonator of the present disclosure exhibiting a small vibration frequency deviation over the above operating temperature range provides a significant advantage in applications.

Figure 2:
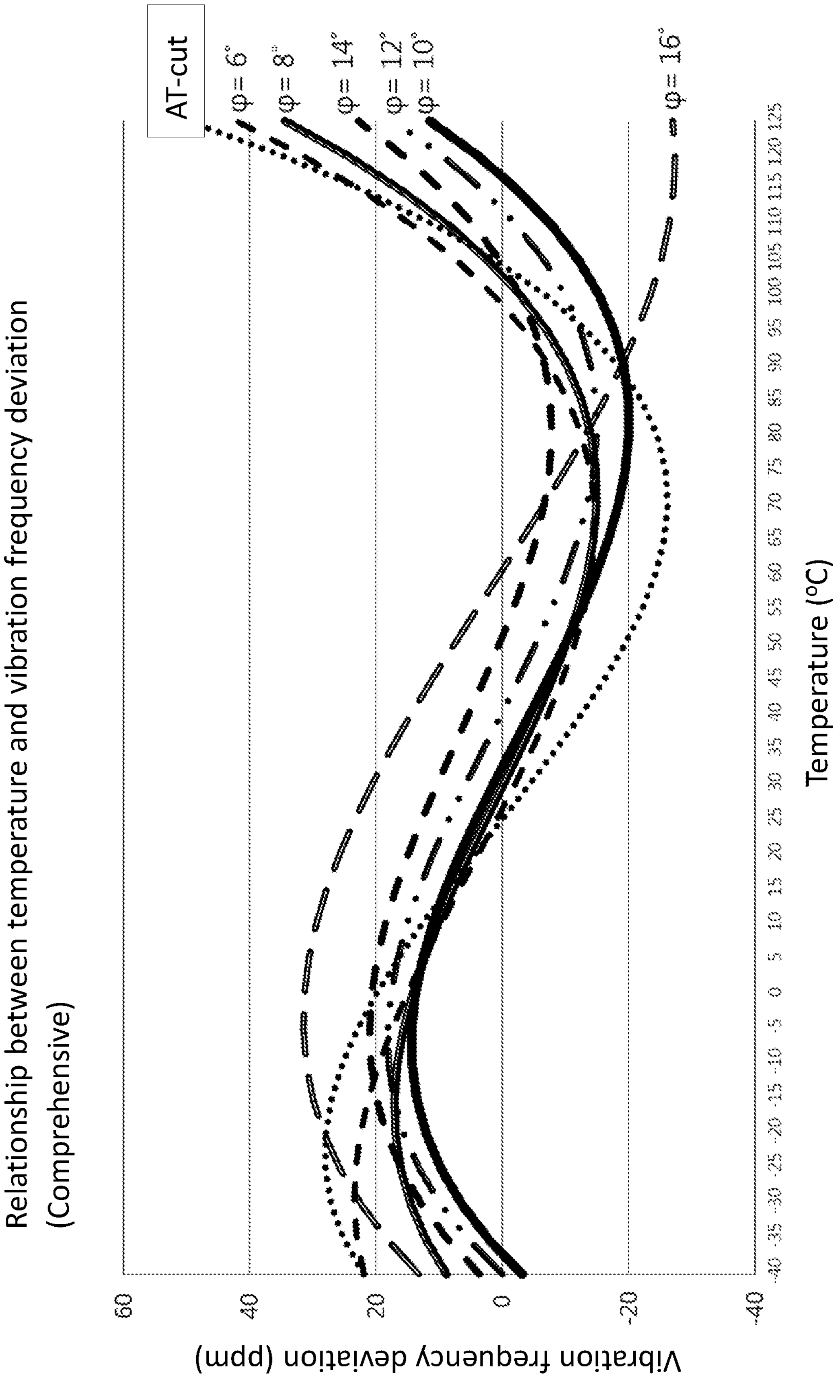
FIG. 2 is a graph showing a relationship between temperature and vibration frequency deviation (comprehensive) according to some embodiments of the present disclosure.

Regarding the operations of a quartz crystal in the operating temperature range, for example, as shown in the graph (comprehensive) of the relationship between temperature and vibration frequency deviation in FIG. 2, a quartz crystal cut by use of the AT-cut has an inflection point of the vibration frequency deviation at the room temperature (about 25° C.), and at this temperature, the AT-cut quartz crystal has the characteristic of having no vibration frequency deviation, which is the reason that AT-cut quartz crystals are widely used. However, once the operating temperature changes, e.g., when the temperature rises to about 50° C. or drops to about 0° C., the vibration frequency deviation of the AT-cut quartz crystal will go beyond the range of ±20 ppm due to drastic changes. Specifically, the relationship between the temperature and the vibration frequency deviation of the AT-cut quartz crystal is also characterized by a cubic curve. The AT-cut quartz crystal has a negative peak value of the vibration frequency deviation that is about −26.2 ppm at about 70° C. Then as the temperature rises, the vibration frequency deviation can be maintained within the range between 20 ppm and −20 ppm in the temperature range from about 90° C. to about 110° C., however, after the temperature rises above about 110° C., the vibration frequency deviation increases continuously and sharply, reaching about 50 ppm at about 125° C., which is no longer in an allowable vibration frequency deviation level. On the other hand, in the cases of lower operating temperatures, the AT-cut quartz crystal also has a vibration frequency deviation of exceeding 20 ppm in the sub-zero operating temperature range from about −40° C. to about 0° C., which means that the AT-cut quartz crystal does not perform well at low temperatures.

In view of the above description that the characteristics of the quartz crystals obtained by the AT-cut do not meet the requirements of the vibration frequency deviation in some operating temperature ranges, embodiments of the present disclosure use the second angle φ as a correction angle (in other words, the AT-cut can be regarded as a case where the second angle φ is 0 degree), and utilize the characteristics of the quartz crystal obtained by further rotating an angle at which the quartz bar is to be cut, in order for the quartz crystal to meet the requirement of the vibration frequency deviation in a wide operating temperature range.

Figure 3:
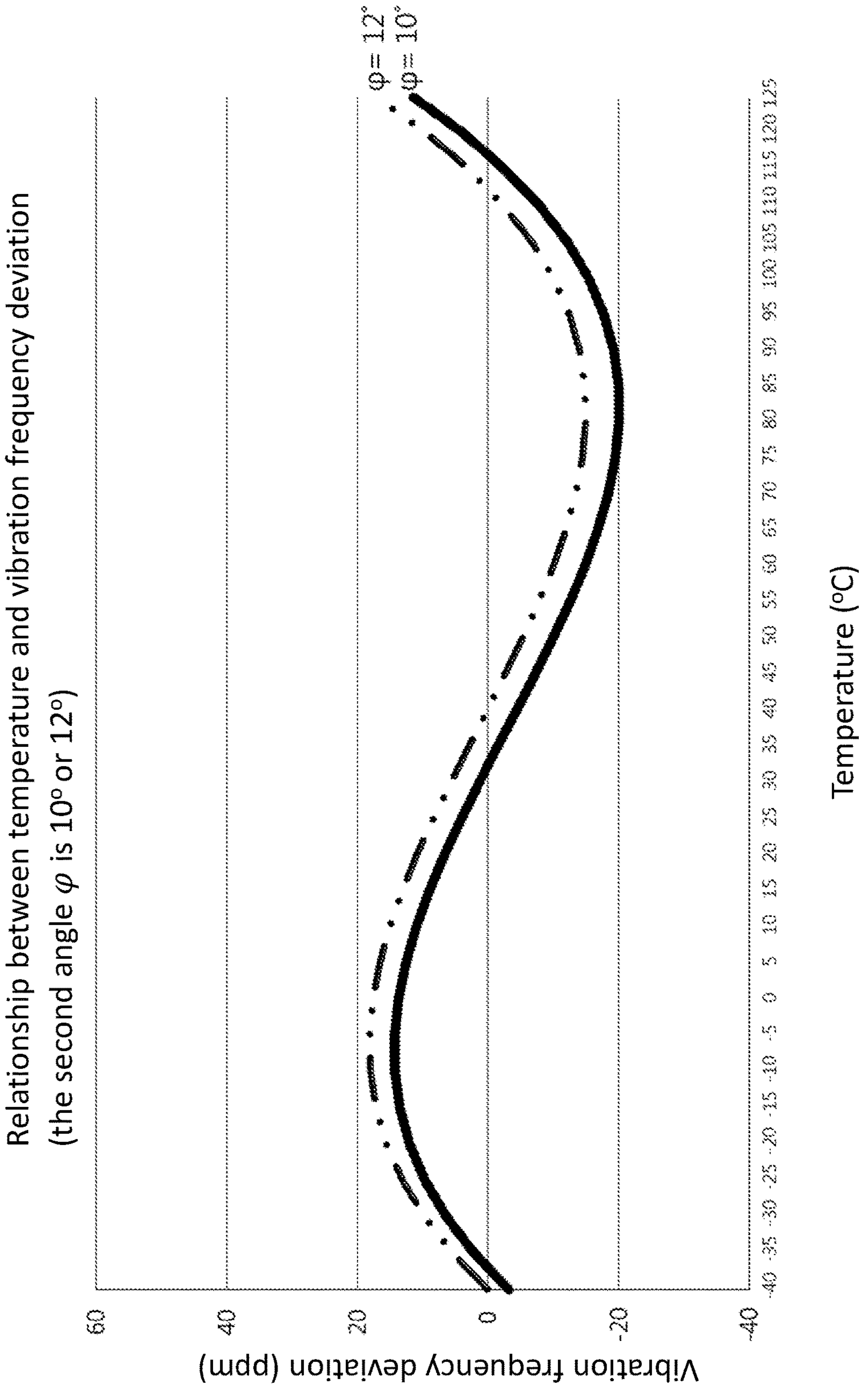
FIG. 3 is a graph showing a relationship between temperature and vibration frequency deviation according to some embodiments of the present disclosure (a second angle φ is 10 degrees or 12 degrees)

As mentioned above, in some embodiments of the present disclosure, the second angle φ is between about 10 degrees and about 12 degrees. Taking the second angle φ being 10 degrees as an example, the first angle θ as disclosed above may be formed between the major face 20A of the quartz crystal and the light axis (Z) by rotating about the electrical axis, the second angle φ of 10 degrees may then be formed between the major face 20A and the electrical axis (X) by rotating about the light axis, and thereafter, the quartz bar is cut. The quartz crystal obtained in this way has a relationship between temperature and vibration frequency deviation as shown in FIG. 3, which has the characteristics of a cubic curve, and has a vibration frequency deviation within ±20 ppm in the operating temperature range from about −40° C. to about 125° C. In particular, the quartz crystal has a positive peak value of the vibration frequency deviation that is about 14 ppm in the range from about −10° C. to about −5° C.; and it has a negative peak value of the vibration frequency deviation that is about −20 ppm in the range from about 80° C. to about 85° C. In addition, the quartz crystal has a vibration frequency deviation inflection point in the range from about 30° C. to about 35° C.

If the second angle φ is adjusted to be 12°, as shown in FIG. 3, the relationship between temperature and vibration frequency deviation of the obtained quartz crystal also presents the characteristics of a cubic curve, and the vibration frequency deviation is within ±20 ppm in the operating temperature range between about −40° C. and about 125° C. In particular, in the range from about −10° C. to about −5° C., the quartz crystal has a positive peak value of the vibration frequency deviation that is about 18 ppm; and in the range from about 80° C. to about 85° C., the vibration frequency deviation has a negative peak value of about −15 ppm. In addition, the quartz crystal has a vibration frequency deviation inflection point in the range from about 40° C. to about 45° C.

The above-described embodiments of the present disclosure use a difference of two degrees as an exemplary example, however, the second angle φ is not limited to be only about 10 degrees or about 12 degrees. When the second angle φ is within the range from about 10 degrees to about 12 degrees, the cut quartz crystal is able to have a vibration frequency deviation within ±20 ppm in the operating temperature range between about −40° C. and about 125° C., and the inflection point of the vibration frequency deviation of the quartz crystal falls within the range from about 30° C. to about 35° C. or the range from about 40° C. to about 45° C., i.e., the inflection point of the vibration frequency deviation varies in these temperature ranges with a small adjustment of the second angle φ.

Figure 4:
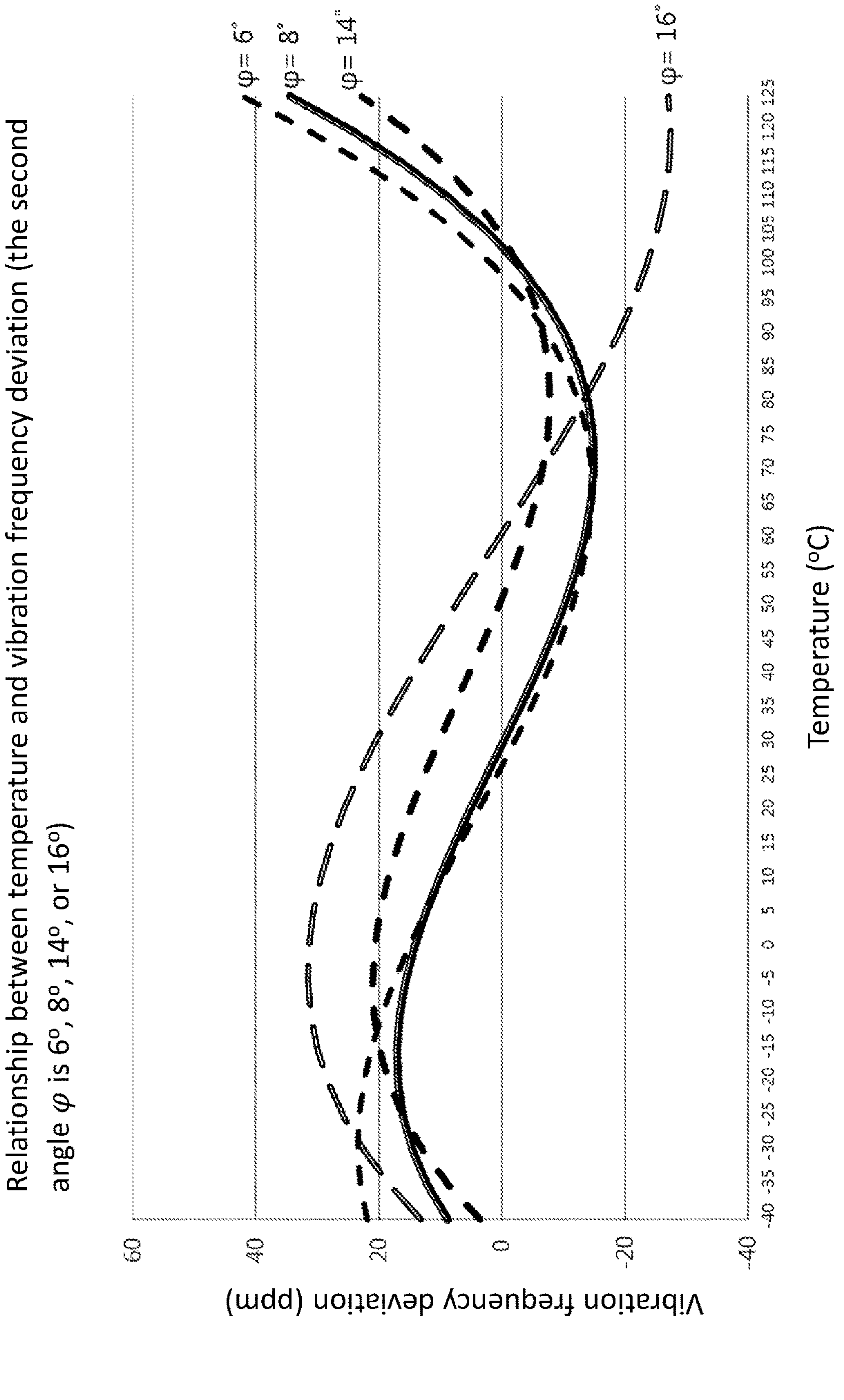
FIG. 4 is a graph showing a relationship between temperature and vibration frequency deviation according to some comparative examples (the second angle φ is 6 degrees, 8 degrees, 14 degrees or 16 degrees)

In some comparative embodiments, as shown in FIG. 4, without changing the first angle θ, if the second angle φ is adjusted to be a relatively small angle such as about 6 degrees, about 8 degrees, and so on, or the second angle φ is adjusted to be a relatively large angle such as about 14 degrees, about 16 degrees, and so on, for the quartz crystals obtained with these comparative angles, the corresponding relationship between temperature and vibration frequency deviation will have vibration frequency deviation values beyond the range of 20 ppm in the operating temperature range from about −40° C. to 125° C. Thus, such obtained quartz crystals do not meet the component operation quality standard set for the above operating temperature ranges.

For example, first, as shown in FIG. 4, when the second angle φ is adjusted to be about 6°, the obtained quartz crystal has vibration frequency deviation values that change relatively severely in the low temperature range from about −40° C. to about −15° C. and in the high temperature range from about 115° C. to about 125° C., and does not meet the standard.

Second, as shown in FIG. 4, when the second angle φ is adjusted to be about 8°, although this case is relatively close to an embodiment of the present disclosure with the second angle φ being about 10°, the obtained quartz crystal still has vibration frequency deviation values that change relatively severely in the high temperature range from about 120° C. to about 125° C., and does not meet the standard.

Third, as shown in FIG. 4, when the second angle φ is adjusted to be about 14°, the obtained quartz crystal has vibration frequency deviation values that change relatively severely in the low temperature range from about −10° C. to about 0° C. and the high temperature range from about 120° C. to about 125° C., and does not meet the standard.

Then, as shown in FIG. 4, when the second angle φ is adjusted to be about 16°, the obtained quartz crystal has vibration frequency deviation values that change relatively severely in the temperature range from about −30° C. to about 30° C. and in the temperature range from about 95° C. to about 125° C., and does not meet the standard.

In view of above, the embodiments of the present disclosure provide a quartz bar, and the cutting angle obtained by double rotation enables a quartz crystal that is cut from the quartz bar at this cutting angle to maintain a better vibration frequency deviation in a larger operating temperature range, which enables a quartz crystal resonator utilizing the quartz crystal to comply with stricter industrial standards and be suitable for operating environments with more severe temperature changes.

Figure 5:
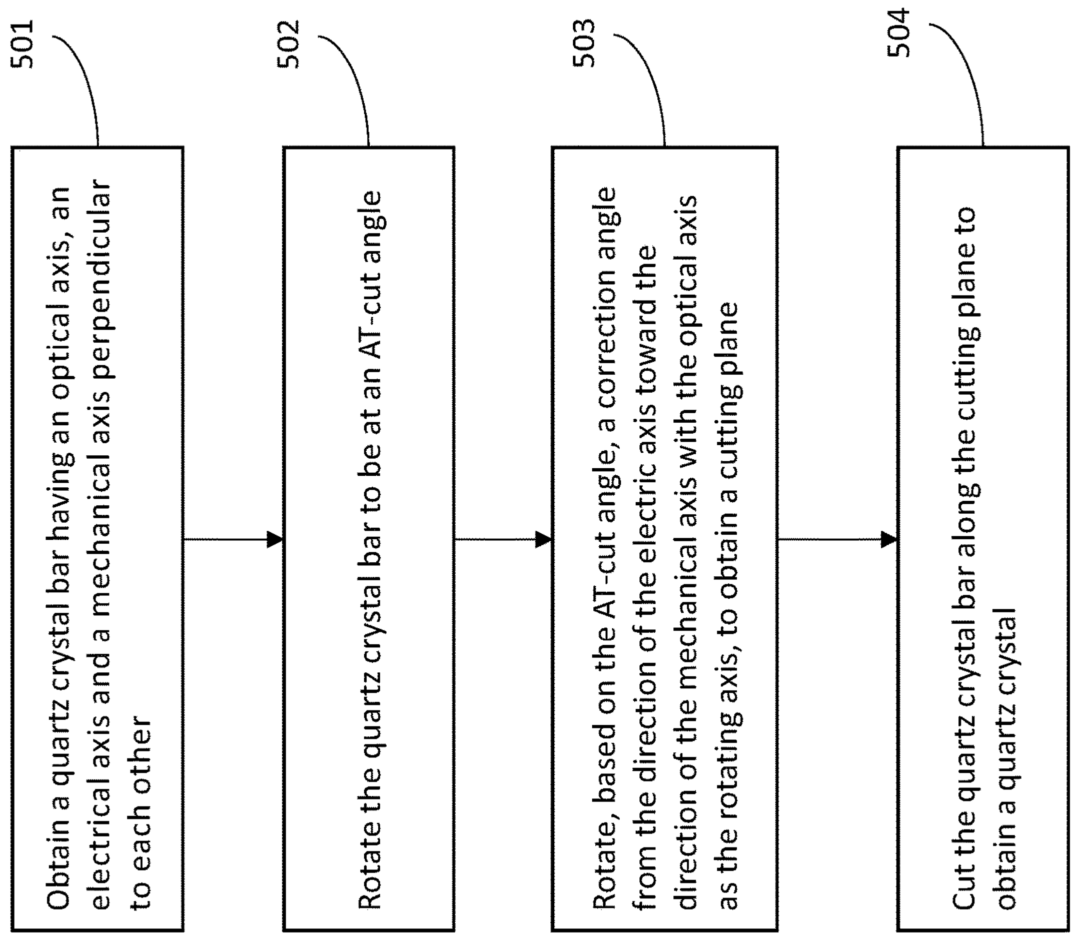
FIG. 5 is a flowchart of a method for manufacturing a quartz crystal resonator according to some embodiments of the present disclosure.

In some embodiments of the present disclosure, a method is also provided for making a quartz crystal resonator. As shown in FIG. 5, the method includes step 501: obtaining a quartz bar, which has a light axis, an electrical axis and a mechanical axis perpendicular to one another; Step 502: rotating the quartz bar to be at an AT-cut angle; Step 503: based on the AT-cut angle, and rotating a correction angle from the direction of the electrical axis toward the direction of the mechanical axis with the light axis as the rotating axis, to obtain a cutting plane; and step 504: cutting the quartz bar along the cutting plane to obtain a quartz crystal. In this way, by the use of the correction angle, the cut quartz crystal can have a vibration frequency deviation within ±20 ppm in an operating temperature range from about −40° C. to about 125° C. Further, in some embodiments, the AT-cut angle is an angle rotated by about 35 degrees to about 36 degrees from the direction of the light axis to the direction of the mechanical axis, with the electrical axis as the rotating axis.

In some embodiments, the cut quartz crystal may be included in a structure of a quartz crystal resonator through a packaging process. In addition, the oscillation frequency of the quartz crystal is related to the thickness of the quartz crystal, for example, as the oscillation frequency increases, the thickness of the chip will be correspondingly thinner. Therefore, in some embodiments, the method for making the quartz crystal resonator may include a step of: determining a cutting thickness for cutting the quartz bar based on a target frequency of the quartz crystal resonator, to obtain a quartz crystal with a required cutting thickness.

Figure 6:
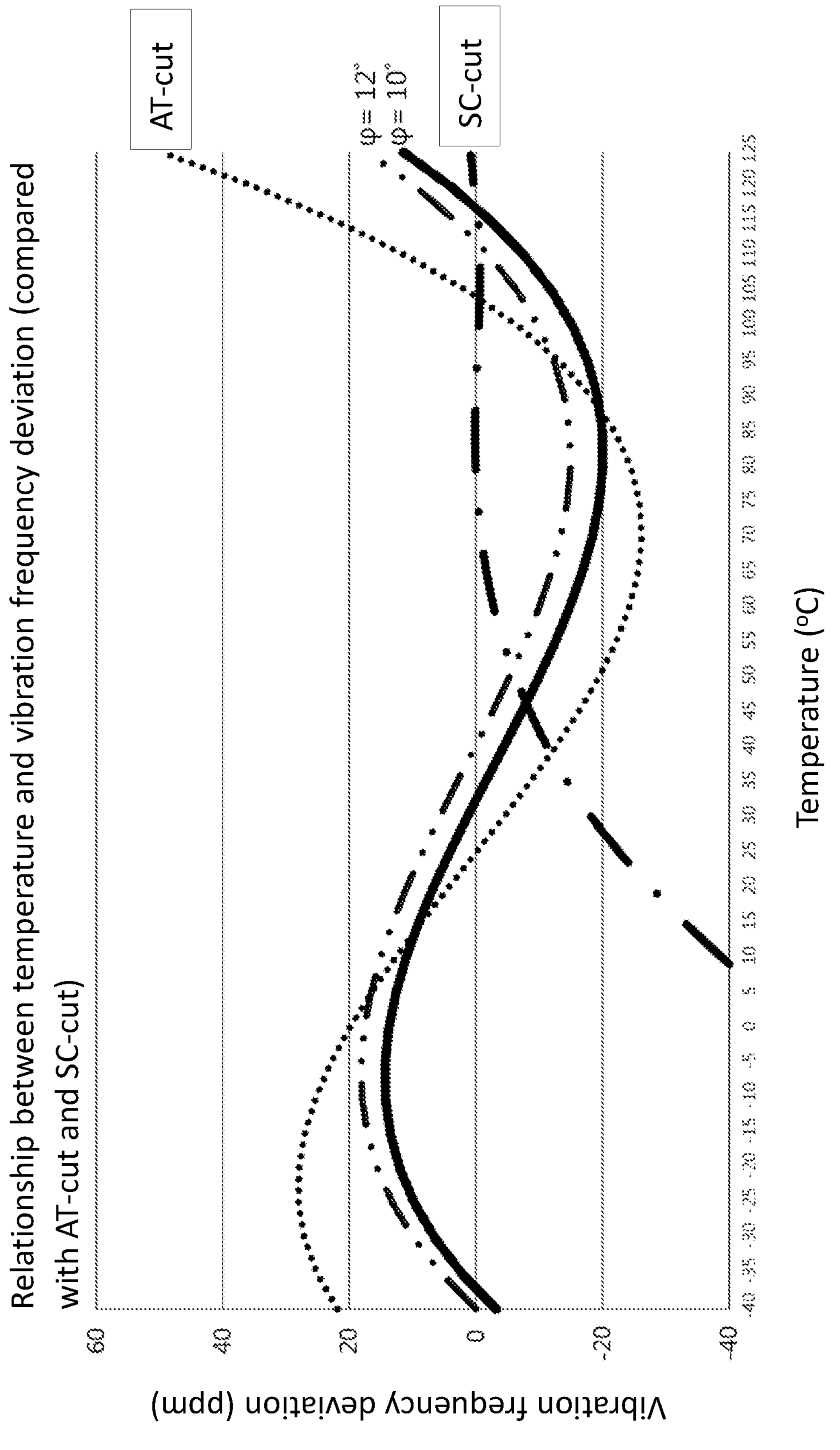
FIG. 6 is a graph showing a relationship between temperature and vibration frequency deviation of according to some embodiments of the present disclosure and some comparative examples (compared with AT-cut and SC-cut).

Comparing some embodiments of the present disclosure with quartz crystals obtained by AT-cut (the second angle φ is 0°), as shown in FIG. 6, the quartz crystals cut according to the embodiments of the present disclosure meet the requirements of the vibration frequency deviation in a wider operating temperature range, and especially in the operating temperature range from about −40° C. to about 125° C., and they at least meet the standard of having a vibration frequency deviation within ±20 ppm. Compared with other existing quartz crystal cutting methods, for example, the aforementioned SC-cut, which also has methods involving the use of double rotation to obtain the cutting angle, the SC-cut is a cutting method that increases the vibration frequency deviation inflection point of the quartz crystal from about 25° C. of the AT-cut to about 93° C. However, the SC-cut is to increment the main operating temperature range of the quartz crystal to a range relatively higher than that of the AT-cut, and it is unable to provide the specific vibration frequency deviation in a wide operating temperature range, which is provided by the quartz crystal resonator as disclosed in the embodiments of the present disclosure. In fact, as shown in FIG. 6, a SC-cut quartz crystal has a large vibration frequency deviation of more than −20 ppm at a temperature below about 30° C., and thus, it cannot be applied to an operating environment having a temperature below the room temperature.

The foregoing provides features of certain embodiments of the present disclosure for those ordinarily skilled in the art to more fully understand the various aspects of the present disclosure. Those of ordinary skill in the art of the present disclosure should understand that they can readily design or modify other processes and structures based on the present disclosure to achieve the same purposes and/or achieve the same advantages as the embodiments herein. Those of ordinary skill in the art of the present disclosure should also understand that these equivalent embodiments still belong to the spirit and scope of the present disclosure, and various alterations, substitutions and changes can be made without departing from the spirit and scope of the present disclosure.

Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A quartz crystal resonator comprising:

a quartz crystal obtained from a quartz bar, the quartz bar having a light axis, an electrical axis along a length of the quartz bar, and a mechanical axis that are perpendicular to one another, and the quartz crystal having a major face cut from the quartz bar along a cutting plane, wherein the cutting plane has a first angle of about 35° to about 36° from the light axis rotated around the electrical axis, and has a second angle from the electrical axis rotated around the light axis, such that the quartz crystal has a vibration frequency deviation inflection point in a range from about 30° C. to about 45° C.

2. The quartz crystal resonator of claim 1, wherein the first angle is about 35 degrees 15 minutes.

3. The quartz crystal resonator of claim 1, wherein the second angle is about 10° to about 12°.

4. The quartz crystal resonator of claim 3, wherein the quartz crystal has a vibration frequency deviation within a range from −20 parts per million (ppm) to +20 ppm over an operating temperature range from about −40° C. to about 125° C.

5. The quartz crystal resonator of claim 3, wherein the second angle is about 12°.

6. The quartz crystal resonator of claim 5, wherein a vibration frequency deviation of the quartz crystal has a positive peak value over a range from about −10° C. to about 0° C.

7. The quartz crystal resonator of claim 6, wherein the positive peak value is from about 14 ppm to about 18 ppm.

8. The quartz crystal resonator of claim 5, wherein a vibration frequency deviation of the quartz crystal has a negative peak value over a range from about 80° C. to about 90° C.

9. The quartz crystal resonator of claim 8, wherein the negative peak value is from about −15 ppm to about −20 ppm.

10. A method of making a quartz crystal resonator, comprising:

obtaining a quartz bar, the quartz bar having a light axis, an electrical axis along a length of the quartz bar, and a mechanical axis that are perpendicular to one another;

obtaining a cutting plane by rotating about the electrical axis through a first angle of about 35° to about 36° in a direction from the light axis toward the mechanical axis, and thereafter rotating about the light axis through a second angle of about 10° to about 12° in a direction from the electrical axis to the mechanical axis; and cutting the quartz bar along the cutting plane rotated through the first angle and the second angle to obtain a quartz crystal of the quartz crystal resonator, with the quartz crystal having a vibration frequency deviation inflection point in a range from about 30° C. to about 45° C.

11. The method of claim 10, wherein the second angle is about 12°, and the quartz crystal has a vibration frequency deviation inflection point in a range from about 40° C. to about 45° C.

12. The method of claim 11, wherein the quartz crystal has a vibration frequency deviation within a range from −20 parts per million (ppm) to +20 ppm over an operating temperature range from about −40° C. to about 125° C.

13. The method of claim 10, wherein the second angle is about 10°, and the quartz crystal has a vibration frequency deviation inflection point in a range from about 30° C. to about 35° C.

14. The method of claim 10, further comprising:

determining a cutting thickness of the quartz crystal according to a target frequency of the quartz crystal resonator.

15. A method of making a quartz crystal resonator, comprising:

obtaining a quartz bar, the quartz bar having a light axis, an electrical axis along a length of the quartz bar, and a mechanical axis that are perpendicular to one another;

rotating the quartz bar to orient the quartz bar at an AT-cut angle of about 35.4° to 36°;

based on the AT-cut angle, obtaining a cutting plane by rotating about the light axis through an angle in a direction from the electrical axis toward the mechanical axis; and cutting the quartz bar along the cutting plane to obtain a quartz crystal of the quartz crystal resonator; and wherein the angle is determined such that the obtained quartz crystal has a vibration frequency deviation within a range from −20 parts per million (ppm) to +20 ppm over an operating temperature range from about −40° C. to about 125° C.

16. The method of claim 15, wherein the quartz crystal has a vibration frequency deviation inflection point in a range from about 40° C. to about 45° C.

17. The method of claim 15, wherein the angle is about 10° to about 12°.

18. The method of claim 15, wherein the angle is about 12°.

19. The method of claim 18, wherein the vibration frequency deviation of the quartz crystal has a positive peak value of about 18 ppm over a range from about −10° C. to about −5° C.

20. The method of claim 18, wherein the vibration frequency deviation of the quartz crystal has a negative peak value of about −15 ppm over a range from about 80° C. to about 85° C.

* * * * *